United States Patent [19]

Erdmann et al.

[11] 4,424,270

[45] Jan. 3, 1984

[54] LIGHT-SENSITIVE MIXTURE COMPRISING A NAPHTHOQUINONEDIAZIDESULFONIC ACID ESTER AND PROCESS FOR PREPARING SAID ESTER

[75] Inventors: Fritz Erdmann; Ulrich Simon, both of Mainz, Fed. Rep. of Germany

[73] Assignee: Hoechst Aktiengesellschaft, Frankfurt am Main, Fed. Rep. of Germany

[21] Appl. No.: 333,338

[22] Filed: Dec. 22, 1981

[30] Foreign Application Priority Data

Jan. 3, 1981 [DE] Fed. Rep. of Germany ....... 3100077

[51] Int. Cl.$^3$ ............................ G03C 1/54; G03F 7/08
[52] U.S. Cl. .................................... 430/166; 430/181; 430/190; 430/191; 430/192; 430/193
[58] Field of Search ............... 430/181, 190, 191, 192, 430/193, 166

[56] References Cited

U.S. PATENT DOCUMENTS

| | | | |
|---|---|---|---|
| 3,046,120 | 7/1962 | Schmidt et al. | 96/33 |
| 3,647,443 | 3/1972 | Rauner et al. | 96/33 |
| 3,857,896 | 12/1974 | Desjarlais | 430/181 |
| 3,969,118 | 7/1976 | Stahlhofen et al. | 430/193 |
| 4,115,128 | 9/1978 | Kita | 96/91 D |
| 4,275,139 | 6/1981 | Stahlhofen | 430/192 |

FOREIGN PATENT DOCUMENTS 1113759 5/1968 United Kingdom .
1330932 9/1973 United Kingdom .

*Primary Examiner*—John E. Kittle
*Assistant Examiner*—Robert A. Wax
*Attorney, Agent, or Firm*—Schwartz, Jeffery, Schwaab, Mack, Blumenthal & Koch

[57] ABSTRACT

A light-sensitive mixture comprising a water-insoluble binder soluble in aqueous alkaline solutions, and the reaction product of a naphthoquinonediazidesulfonyl halide with a mixture composed of a low molecular weight compound having a definite structure and molecular size containing at least one phenolic hydroxyl group, and of a polymeric compound having recurring units, each of which contains at least one phenolic hydroxyl group. The mixture is useful in producing printing plates and photoresists and has the advantage that the naphthoquinonediazidesulfonic acid ester contained therein is non-explosive.

21 Claims, No Drawings

LIGHT-SENSITIVE MIXTURE COMPRISING A NAPHTHOQUINONEDIAZIDESULFONIC ACID ESTER AND PROCESS FOR PREPARING SAID ESTER

BACKGROUND OF THE INVENTION

The present invention relates to a light-sensitive mixture comprising a naphthoquinonediazidesulfonic acid ester and a binder, which is insoluble in water but is soluble in aqueous alkaline solutions. Such mixtures are particularly suited for preparing printing plates or photoresists.

Mixtures of the foregoing general type and light-sensitive copying materials prepared therefrom are known. Generally, such mixtures contain a naphthoquinonediazidesulfonic acid ester of a monohydric or polyhydric phenol such as a polyhydroxybenzophenone, polyhydroxydinaphthylmethane, polyhydroxydiphenylmethane or 4-(2-phenylprop-2-yl)-phenol.

Amongst these relatively low molecular weight esters, the representatives which have two or more naphthoquinonediazide groups in the molecule are particularly preferred in practice because of their relatively high light-sensitivity, their good developer resistance and the long printing runs obtainable from printing plates prepared therewith. However, many of these compounds, and particularly the preferred representatives having a relatively high content of diazo groups, have the disadvantage that they present an explosion hazard. This means that their preparation, storage and transport must be carried out under very stringent safety precautions and in relatively small portions. So far as possible, the storage and transport of large quantities of such compounds is avoided altogether, and such compounds are, if possible, processed on site and as soon as possible after they are produced.

However, as a result of the considerable world-wide increase in the consumption of positive-action printing plates which have been presensitized with o-quinone diazides, it has been necessary to establish coating plants at an increasing number of sites. It would be desirable if such scattered sites could be supplied with the necessary chemicals from a central point without risk. In the case of naphthoquinonediazidesulfonic acid esters, however, this has become increasingly difficult because of rising safety standards all over the world.

Attempts have been made to solve this problem by mixing the explosive compounds before transport with resins, such as the phenolic resins customarily used in photosensitive coatings, or with other polymeric compounds, but this proposal also requires that the dangerous compound first be prepared and isolated, and handled during mixing. As far as we are aware, no other solutions to this problem have been disclosed. Indeed, the problem itself has hardly been mentioned in the literature.

On the other hand, it is known to prepare and use high molecular weight o-quinone diazides to solve other problems. German Pat. No. 865,860 describes the reaction of o-quinonediazidesulfonyl halides with phenolic resins and the use of the reaction products for coating printing plates, it being necessary to prevent the quinone diazides from crystallizing in the layer. However, the light-sensitivity and other technical properties of these compounds are insufficient for present-day copying and printing requirements.

British Pat. No. 1,113,759 describes polymeric condensation products of pyrogallol with acetone which have been esterified with naphthoquinonediazidesulfonic acids. These products are said to exhibit improved adhesion to aluminum. These products also are much less effective for copying and printing than the low molecular weight naphthoquinonediazidesulfonic acid esters described above.

German Auslegeschrift No. 2,044,868 describes the use of esters formed from naphthoquinonediazidesulfonic acids and polyglycols for preparing photoresist materials. These compounds are said to make the layers less brittle. They have the disadvantage that, because of their oily or soft, resinous consistency, they are difficult to purify. Although they are suitable for use as photoresist materials, they are not sufficiently oleophilic and produce too short a printing run for use in manufacturing offset printing plates.

German Offenlegungsschrift No. 2,146,166 describes naphthoquinonediazidesulfonic acid esters of bisphenol/formaldehyde condensation resins. These compounds also fail to provide technical properties for copying and printing comparable to the initially described low molecular weight naphthoquinone diazides.

SUMMARY OF THE INVENTION

Accordingly, it is the object of the present invention to produce an improved light-sensitive mixture comprising a naphthoquinonediazidesulfonic acid ester and a water-insoluble binder soluble in aqueous alkaline solutions.

Another object of the invention is to produce a light-sensitive naphthoquinonediazidesulfonic acid ester material which is non-explosive.

A further object of the present invention is to produce a light-sensitive mixture comprising a naphthoquinonediazidesulfonic acid mixture which exhibits a high light-sensitivity and good developer resistance.

It is also an object of the present invention to provide a naphthoquinonediazidesulfonic acid ester material which can be safely stored or transported in large quantities.

An additional object of the present invention is to provide a naphthoquinonediazidesulfonic acid ester material which can be produced without the need for stringent safety precautions.

Yet another object of the present invention is to provide a naphthoquinonediazidesulfonic acid ester material which does not need to be produced at the site of ultimate use.

A still further object of the present invention is to provide a light-sensitive mixture comprising a naphthoquinonediazidesulfonic acid ester material which can be used to produce copying materials having properties comparable to the best materials heretofore available.

Additionally, it is an object of the present invention to provide a process for producing a non-explosive naphthoquinonediazidesulfonic acid ester material.

These and other objects of the invention are achieved by providing a light-sensitive mixture comprising a water-insoluble binder soluble in aqueous alkaline solutions and an esterified reaction product of a naphthoquinonediazidesulfonyl halide and a mixture comprising a low molecular weight compound containing at least one phenolic hydroxyl group and having a definite structure and molecular size and a polymeric compound having recurring units each of which contains at least one phenolic hydroxyl group.

The objects of the invention are also achieved by providing a process for preparing a naphthoquinonediazidesulfonic acid ester wherein a naphthoquinonediazidesulfonyl halide is reacted with a mixture comprising a low molecular weight compound containing at least one phenolic hydroxyl group and having a definite structure and molecular size and a polymeric compound having recurring units each of which contains at least one phenolic hydroxyl group.

In a preferred aspect of the invention, the low molecular weight compound contains at least two phenolic hydroxyl groups, and the polymeric compound is a phenolic resin, particularly a phenol-formaldehyde novolac or a cresol-formaldehyde novolac.

DETAILED DESCRIPTION OF PREFERRED EMBODIMENTS

The mixtures of the invention comprise a water-insoluble binder soluble in aqueous alkaline solutions and an ester which is a reaction product of a naphthoquinonediazidesulfonyl halide with a mixture of a low molecular weight compound of definite structure and molecular size, containing at least one phenolic hydroxyl group, and of a polymeric compound having recurring units, each of which contains at least one phenolic hydroxyl group. Preferably, the low molecular weight compound contains at least two phenolic hydroxyl groups.

In another aspect of the invention, a process is provided for preparing a naphthoquinonediazidesulfonic acid ester, in which a naphthoquinonediazidesulfonyl halide is reacted with a mixture of a low molecular weight compound having a definite structure and molecular size containing at least one phenolic hydroxyl group, and of a polymeric compound having recurring units, each of which contains at least one phenolic hydroxyl group. Again, the low molecular weight phenolic compound preferably contains at least two phenolic hydroxyl groups.

The esterification products obtained by the process of the invention can be isolated from the reaction mixture, purified, dried, stored and transported without risk and without exhibiting any tendency to explode. On the other hand, as a result of their content of low molecular weight constituents, the esters of the invention have essentially the same advantageous properties as the known low molecular weight compounds.

Preferred naphthoquinonediazidesulfonyl halides are the chlorides. In principle, the bromides are also suitable. The halide compounds are derived from 1,2-naphthoquinonediazide, particularly 1,2-naphthoquinone-2-diazide. Each molecule may contain one or two sulfonyl halide groups which may be in the 3-, 4-, 5-, 6-, 7- or 8-position of the naphthalene nucleus. Of the monosulfonic acids, the 4-sulfonic acid and the 5-sulfonic acid are used in most cases.

The 5-sulfonic acid is used most preferably. In disulfonic acids, the sulfonic acid groups may be, for example, in the 3,5-, 3,6-, 4,6- or 5,7-positions.

The low molecular weight phenols preferably are compounds having at least two benzene nuclei in the molecule and containing at least two phenolic hydroxyl groups. A preferred group of phenolic compounds is defined by the general formula:

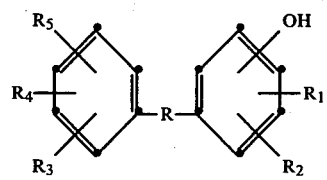

in which

R denotes a single bond or one of the groups CO, S, O, $SO_2$ and $CR_6R_7$, preferably CO or $CR_6R_7$, $R_1$, $R_2$, $R_3$, $R_4$ and $R_5$ represent hydrogen, halogen, hydroxyl groups, alkyl groups having 1 to 4 carbon atoms or alkoxy groups having 1 to 4 carbon atoms, and $R_6$ and $R_7$ represent hydrogen or alkyl groups having 1 to 4 carbon atoms, preferably hydrogen atoms or methyl groups, or in which two of the radicals, $R_3$, $R_4$ and $R_5$ and the radicals $R_1$ and $R_2$ in each case jointly form an aromatic ring, whereby at least one of the radicals $R_1$, $R_2$, $R_3$, $R_4$ and $R_5$ represents a hydroxyl group.

Suitable low molecular weight phenolic compounds include 2,4-dihydroxybenzophenone; 2,3,4-trihydroxybenzophenone; 2,4,2',4'-tetrahydroxydiphenyl sulfide; 2,2'-dihydroxydinaphthylmethane; 4,4'-dihydroxy-2,2'-dimethyl-5,5'-di-tert.-butyldiphenyl sulfide; 4,4'-dihydroxydiphenyl sulfide; 4,6-bis-(2,4-dihydroxyphenylthio)-resorcinol; 2,4,2',4'-tetrahydroxy-3,5,3',5'-tetrabromodiphenyl sulfone; 2,4,2',4'-tetrahydroxy-3,5,3',5'-tetrabromobiphenyl or 2,4-dihydroxy-3,5-dibromobenzophenone.

The polymeric compounds containing phenolic hydroxyl groups are primarily condensation resins of phenols with carbonyl compounds. Preferred reactants in this connection are the known condensation products which are customarily used as constituents of o-naphthoquinone diazide layers. Phenol-formaldehyde novolacs or cresol-formaldehyde novolacs are particularly preferred for this reason. Use of the esterification products of these resins has the advantage that the presence of unesterified phenolic compound causes no problems, since such material is present in the mixture in any event. Additional useful phenolic resins include the condensation products of pyrogallol and acetone described in British Pat. No. 1,113,759. The polycondensation products of polyhydroxybenzophenones and formaldehyde described in German Offenlegungsschrift No. 2,847,878 can also be utilized.

It is supposed that, in the esterification of the mixture of low-molecular weight phenol and polymeric phenol with the sulfonyl halide, the low molecular weight constituent reacts preferentially. This belief is based on the fact that, even at relatively low proportions of low molecular weight phenol, the technical properties of the mixed esterification product in copying and printing are predominantly determined by this low molecular weight proportion and differ markedly from the esterification products formed from pure phenolic resin and naphthoquinonediazidesulfonic acid described in German Pat. No. 865,890.

The ratio of the amount of polymeric phenol to the amount of low molecular weight phenol employed in the esterification reaction should lie in the range from 0.1 to 20 parts by weight of polymeric phenol to 1 part by weight of monomeric phenol. Preferably from 0.3 to 12 parts of polymeric phenol will be used for each part of monomolecular phenol, by weight.

The ratio of the amount of naphthoquinonediazidesulfonyl halide to the total amount of phenolic compounds is also an important factor affecting the result of the esterification. The amount of sulfonyl halide should preferably be sufficient to esterify all the phenolic hydroxyl groups of the low-molecular weight portion. An important criterion for the usefulness of the esterified mixture is its diazo nitrogen content. Products possessing good properties generally have a diazo nitrogen content from about 2 to about 9 percent, preferably from 3 to 8 percent. Esterified products having diazo nitrogen values from 4.5 to 7.5 percent are particularly preferred.

The proportion of the naphthoquinonediazidesulfonic acid ester relative to the non-volatile constituents in the whole light-sensitive mixture can be of the same order of magnitude as in known naphthoquinone diazides. However, the proportion of ester can also be considerably higher, particularly if the esterification product still contains some unesterified phenolic resin. In general, said proportion is from about 5 to about 50 weight percent, preferably from about 10 to about 30 weight percent.

The mixed esters are prepared by first dissolving the sulfonyl halide, which preferably is a sulfonyl chloride, in a suitable solvent in a known manner. Suitable solvents include acetone, butanone, cyclohexanone, methylene chloride or 1,1,1-trichloroethane. The phenolic compounds are also dissolved in one of these solvents, and the phenolic compound solution is added to the solution of acid chloride. It is advantageous to carry out the esterification reaction in the presence of bases, such as alkali metal carbonates or bicarbonates, alkaline earth metal carbonates or bicarbonates, tertiary aliphatic amines or pyridine. The reaction product is isolated by precipitation with a non-solvent or by evaporating the solvent, e.g., by spray drying, and is thereafter dried.

In addition to the above-described light-sensitive esters, the mixtures of the invention may contain other customary ingredients of positive-action naphthoquinonediazide layers, particularly alkali-soluble phenolic resins.

The light-stable, water-insoluble, alkali-soluble, film-forming phenolic resins present in the mixture of the invention have a molecular weight of about 300 to about 5,000 and are prepared by subjecting phenol or a substituted phenol to a condensation reaction with formaldehyde. Suitable substituted phenols include cresol, xylenol, butylphenol and the like. Particularly preferred alkali-soluble, film-forming phenolic resins include phenol-formaldehyde novolacs, cresol-formaldehyde novolacs and phenol-modified xylenol-formaldehyde novolacs. The proportion of phenolic resin ranges from about 50 to about 90 weight percent of the non-volatile constituents of the total mixture. Preferably, the phenolic resin comprises from about 65 to about 85 weight percent of the non-volatile content of the mixture.

The mixtures of the invention may also contain in a known manner fillers, dyestuffs, pigments, photolytic acid-formers such as 1,2-naphthoquinone-2-diazide-4-sulfonyl chloride, and other conventional additives and promoters.

The usual materials used in the copying field may be used as copying layer supports. Suitable examples of support materials include plates or foils of metal, such as aluminum or zinc, having a suitably pretreated surface, multi-metal plates, such as chromium/brass, chromium/copper/aluminum or chromium/copper/zinc, and also paper films, synthetic polymer films, fabrics suitable for screen printing or metallized plates of insulating material. Aluminum sheets which have been suitably pretreated in order to improve the adhesion of the copying layer and to improve the hydrophilic character of the surface of the support are preferred. For example, aluminum sheets which have been roughened mechanically or electrochemically and, if appropriate, anodized or chemically pretreated, may advantageously be used.

The support material may be coated in a known manner, for example, by application with rollers or baths, by spraying or by casting. The weight of the applied layer on a dry basis may suitably range from about 1.0 g/m$^2$ to about 3.0 g/m$^2$.

After being exposed, the light-sensitive copying materials are developed in the customary manner with aqueous-alkaline solutions, which may also contain minor quantities of organic solvents or wetting agents. Development can be effected by immersion, brushing or spraying in suitable processing machines or manually by rinsing or rubbing with a swab.

The invention makes it possible to handle without risk all constituents of the light-sensitive mixture without the necessity of accepting at the same time any significant disadvantages in the copying or printing performance, i.e., a reduction in light-sensitivity, a decrease in the resistance of the copying layer to developer, a loss of gradation, a reduction in image contrast, or a decrease in the length of a printing run.

The invention is described in further detail in the following, non-limiting examples. Parts by weight and parts by volume are related to one another as grams to milliliters. Unless otherwise indicated, quantity ratios and percentages are expressed in terms of weight units.

EXAMPLE 1

An electrolytically roughened and anodically oxidized aluminum plate having an oxide layer weighing about 3 g/m$^2$, was immersed briefly in a 0.1% aqueous solution of polyvinylphosphonic acid at 80° C. and dried. A filtered solution of

| | |
|---|---|
| 1.82 | parts naphthoquinonediazidesulfonic acid ester described below, |
| 0.215 | part 1,2-naphthoquinone-2-diazide-4-sulfonyl chloride, |
| 0.07 | part 2,3,4-trihydroxybenzophenone, |
| 6.621 | parts cresol/formaldehyde novolac having a melting range of 105–120° C. according to DIN 53,181 and |
| 0.079 | part Crystal Violet in |
| 91.195 | parts of a solvent mixture comprising 5 parts by volume tetrahydrofuran, 4 parts by volume ethylene glycol monomethyl ether and 1 part by volume butyl acetate | was applied to the pretreated support and dried. The resulting light-sensitive material was exposed imagewise under a half-tone positive original and was then developed with the following solution:

| | |
|---|---|
| 5.3 | parts sodium metasilicate.9 H$_2$O |
| 3.4 | parts trisodium phosphate.12 H$_2$O and |
| 0.3 | part anhydrous sodium dihydrogen phosphate in |
| 91.0 | parts water. |

The resulting printing plate provided a large number of copies on an offset printing machine. The printing and copying properties of the plate were essentially the same as those of a corresponding plate containing an equivalent quantity of 2,3,4-tris-[1,2-naphthoquinone-2-diazide-5-sulfonyloxy]-benzophenone instead of the naphthoquinonediazide-sulfonic acid ester mixture described below.

The naphthoquinonediazidesulfonic acid ester used in the foregoing formulation was prepared as follows:

A solution of 25.5 parts 1,2-naphthoquinone-2-diazide-5-sulfonyl chloride in 442 parts acetone was clarified with active charcoal. 26.3 parts of the above-mentioned cresol-formaldehyde novolac and 4.4 parts 2,3,4-trihydroxybenzophenone were dissolved in the solution and a solution of 11.9 parts $NaHCO_3$ in 124 parts water and 160 parts saturated sodium chloride solution were added to the mixture. The mixture was stirred for 10 minutes and allowed to stand. The lower phase was then discarded and the acetone solution was allowed to run in the course of a few minutes, into a solution of 6 parts HCl (30%) and 1,500 parts water. The yellow, flocculant, precipitated reaction product was vacuum filtered, washed with water and dried. The yield amounted to 48 parts by weight. The product had a diazo nitrogen content of 4.7 percent and a water content of 1.8 percent.

EXAMPLE 2

Example 1 was repeated except that the naphthoquinonediazidesulfonic acid ester in the coating formulation was replaced by the same amount of the reaction product prepared as follows:

24.7 parts 1,2-naphthoquinone-2-diazide-5-sulfonyl chloride were reacted in the manner described in Example 1, with 7.8 parts of the novolac described in Example 1 and 2.1 parts 2,3,4-trihydroxybenzophenone in 455 parts acetone, in the presence of 20.6 parts $NaHCO_3$, dissolved in water and sodium chloride solution, and minor quantities of a tertiary amine. 28 parts by weight of a product containing 7.5 percent diazo nitrogen and 1 percent water were obtained.

In this example also, the quality and length of printing run of the resulting printing plate were at least comparable to those of a corresponding printing plate produced with known low molecular weight naphthoquinonediazidesulfonic acid esters.

Similar results were obtained if an equal quantity of the isomeric 1,2-naphthoquinone-2-diazide-4-sulfonyl chloride was used instead of the above-mentioned 5-sulfonyl chloride to prepare the naphthoquinonediazidesulfonic acid ester.

EXAMPLE 3

Example 1 was repeated, except that the naphthoquinonediazidesulfonic acid ester in the coating solution was replaced by an equal quantity of a product prepared as follows:

The following ingredients were reacted analoqously to the procedure described in Example 1:

| | |
|---|---|
| 25 | parts 1,2-naphthoquinone-2-diazide-5-sulfonyl chloride |
| 1 | part 2,2',4,4'-tetrahydroxydiphenyl sulfide |
| 2.6 | parts 2,3,4-trihydroxybenzophenone and |
| 25 | parts of the novolac described in Example 1. |

47 parts by weight of a reaction product having a diazo nitrogen content of 5.0 percent and a water content of 1.8 percent were obtained.

The technical properties of the resulting plate in copying and printing were at least equivalent to those of the comparison plate described in Example 1.

EXAMPLE 4

Example 1 was repeated except that the naphthoquinonediazidesulfonic acid ester in the coating solution was replaced by an equal quantity of a product prepared as follows:

The following reactants were reacted analogously to the procedure described in Example 1:

| | |
|---|---|
| 40 | parts of the novolac described in Example 1, |
| 8.35 | parts of the condensation product of 2 moles 2,3,4-trihydroxybenzophenone and 1 mole formaldehyde (described in German Offenlegungsschrift 2,847,878, Example 1) and |
| 48.2 | parts 1,2-naphthoquinone-2-diazide-5-sulfonyl chloride. |

92 parts by weight of a reaction product having a diazo nitrogen content of 5.0 percent and a water content of 0.9 percent were obtained.

The resulting printing plate was comparable in quality and length of printing run to known printing plates containing only low molecular weight naphthoquinonediazidesulfonic acid esters.

Similar results were obtained if the naphthoquinonediazidesulfonic acid ester in the coating solution was replaced by an equal quantity of the following reaction product:

The following reactants were reacted as in Example 1;

| | |
|---|---|
| 40 | parts of the novolac described in Example 1, |
| 13.4 | parts of the above-described condensation product of 2,3,4-trihydroxybenzophenone and formaldehyde, and |
| 53.9 | parts 1,2-naphthoquinone-2-diazide-5-sulfonyl chloride. |

93 parts by weight of a reaction product having a diazo nitrogen content of 5.6 percent and a water content of 1.2 percent were obtained.

EXAMPLE 5

An electrolytically roughened and anodically oxidized aluminum plate which had an oxide layer weighing about 3 $g/m^2$ was coated with a solution of

| | |
|---|---|
| 3.83 | parts naphthoquinonediazidesulfonic acid ester described below, |
| 0.21 | part 1,2-naphthoquinone-2-diazide-4-sulfonyl chloride, |
| 0.07 | part 2,3,4-trihydroxybenzophenone, |
| 4.31 | parts of the novolac described in Example 1, and |
| 0.08 | part Crystal Violet in |
| 91.50 | parts of a solvent mixture comprising 5 parts by volume tetrahydrofuran, 4 parts by volume ethylene glycol monomethyl ether and 1 part by volume butyl acetate, | and was dried. The light-sensitive material was exposed and developed as in Example 1 and gave a planographic printing plate which produced long printing runs. The technical properties of the plate in copying and printing were substantially the same as those of the comparison plate described in Example 1 containing a low molecular weight naphthogquinonediazidesulfonic acid ester.

The naphthoquinonediazidesulfonic acid ester used in the above formulation was prepared as follows:

A solution of 14.7 parts 1,2-naphthoquinone-2-diazide-5,7-bis-sulfonyl chloride, 18.4 parts of the novolac described in Example 1 and 4.6 parts 2,3,4-trihydroxybenzophenone in 363 parts tetrahydrofuran was added while stirring with a high-speed stirrer, over a period of 30 minutes to a solution of 8 parts sodium bicarbonate in 84 parts water and 84 parts saturated sodium chloride solution. After allowing the mixture to stand and separating the lower liquid phase, the solution was diluted with 174 parts tetrahydrofuran, and the reaction product was precipitated by pouring the mixture, within a period of 10 minutes, into a solution of 6 parts 30% hydrochloric acid in 600 parts water. After vacuum filtration, washing until neutral with water and drying, 34.1 parts by weight of a yellow product having a nitrogen content of 3.1 percent and a water content of 0.7 percent were obtained.

Similar results were obtained if an equal quantity of the reaction product formed from 37 parts 1,2-naphthoquinone-2-diazide-5-sulfonyl chloride, 18.6 parts of a polycondensation product formed from pyrogallol and acetone and 2.3 parts 2,3,4-trihydroxybenzophenone was used instead of the above-described naphthoquinonediazidesulfonic acid ester.

EXAMPLE 6

A photoresist solution was prepared by dissolving:

| | |
|---|---|
| 7 | parts naphthoquinonediazidesulfonic acid ester described in Example 1 and |
| 23 | parts of a cresol/formaldehyde novolac having a softening range of 105–120° C., measured by the capillary method of DIN 53,181, in |
| 83 | parts of a solvent mixture composed of 82 percent ethylene glycol ethyl ether-acetate, 9 percent butyl acetate and 9 percent xylene, | and the viscous solution was filtered. The resulting solution was spin-coated onto a commercial insulating material laminated to a copper foil 30 μm thick so that after drying a layer thickness of approximately 1 μm was obtained. The layer was exposed under an original of a circuit pattern and developed with the developer described in Example 1, whereby the exposed parts of the layer were washed away. The exposed copper was dissolved with iron-III chloride solution and the resist stencil was removed by exposure to the illumination of a metal halide lamp and rinsing with the developer solution. A printed circuit was obtained.

The foregoing embodiments have been described merely to illustrate the invention and are not intended to be limiting. Since modifications of the disclosed embodiments incorporating the spirit and substance of the invention may occur to persons skilled in the art, the scope of the invention is to be limited soley with respect to the appended claims.

We claim:
1. A light-sensitive mixture comprising:
   (a) a water-insoluble binder soluble in aqueous alkaline solution, and
   (b) an esterified reaction product of a naphthoquinonediazidesulfonyl halide and a mixture comprising a low molecular weight compound containing at least one phenolic hydroxyl group and a polymeric compound having recurring untis each of which contains at least one phenolic hydroxyl group, wherein said low molecular weight compound containing at least one phenolic hydroxyl group corresponds to the formula

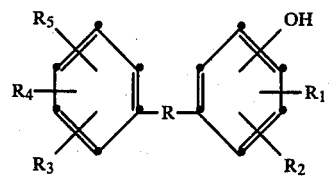

wherein
R denotes a single bond or one of the groups of CO, S, O, $SO_2$ and $CR_6R_7$;
$R_1$, $R_2$, $R_3$, $R_4$ and $R_5$ represent hydrogen, halogen, hydroxyl groups, alkyl groups having 1 to 4 carbon atoms or alkoxy groups having 1 to 4 carbon atoms; and
$R_6$ and $R_7$ represent hydrogen or alkyl groups having 1 to 4 carbon atoms;
or wherein two of the radicals $R_3$, $R_4$ and $R_5$ and the radicals $R_1$ and $R_2$ in each case jointly form a fused aromatic ring;
at least one of the radicals $R_1$, $R_2$, $R_3$, $R_4$, and $R_5$ representing a hydroxyl group.

2. A light-sensitive mixture according to claim 1, wherein said low molecular weight compound contains at least two phenolic hydroxyl groups.

3. A light-sensitive mixture according to claim 1, wherein said napthoquinonediazidesulfonyl halide is a 1,2-naphthoquinone-2-diazide-sulfonyl chloride.

4. A light-sensitive mixture according to claim 1, wherein said naphthoquinonediazidesulfonyl halide is formed from a monosulfonic acid compound.

5. A light-sensitive mixture according to claim 1, wherein said naphthoquinonediazidesulfonyl halide is formed from a disulfonic acid compound.

6. A light-sensitive mixture according to claim 1, wherein said low molecular weight compound containing at least one phenolic hydroxyl group is selected from the group consisting of 2,4-dihydroxybenzophenone; 2,3,4-trihydroxybenzophenone; 2,4,2',4'-tetrahydroxydiphenyl sulfide; 2,2'-dihydroxydinaphthylmethane; 4,4'-dihydroxy-2,2'-dimethyl-5,5'-di-tert.-butyldiphenyl sulfide; 4,4'-dihydroxydiphenyl sulfide; 4,6-bis-(2,4-dihydroxyphenylthio)-resorcinol; 2,4,2',4'-tetrahydroxy-3,5,3',5'-tetrabromodiphenyl sulfone; 2,4,2',4'-tetrahydroxy-3,5,3',5'-tetrabromobiphenyl, and 2,4-dihydroxy-3,5-dibromobenzophenone.

7. A light-sensitive mixture according to claim 1, wherein said polymeric compound having recurring units comprises a phenolic resin.

8. A light-sensitive mixture according to claim 7, wherein said polymeric compound having recurring units comprises a resin selected from the group consisting of phenol-formaldehyde novolac resins and cresol-formaldehyde novolac resins.

9. A light-sensitive mixture according to claim 1, wherein the weight ratio of polymeric compound having recurring units to said low molecular weight compound lies in the range from 0.1 to 20 parts by weight of polymeric compound per 1 part by weight of low molecular compound.

10. A light-sensitive mixture according to claim 9, wherein the weight ratio of polymeric compound having recurring units to said low molecular weight compound lies in the range from 0.3 to 12 parts by weight of polymeric compound per 1 part by weight of low molecular compound.

11. A light-sensitive mixture according to claim 1, wherein the proportion of naphthoquinonediazidesulfonyl halide reacted with said reaction mixture is sufficient to completely esterify all of the phenolic hydroxyl groups of said low molecular weight compound.

12. A light-sensitive mixture according to claim 1, wherein said esterified reaction product has a diazo nitrogen content from about 2 to about 9 weight percent.

13. A light-sensitive mixture according to claim 12, wherein said esterified reaction product has a diazo nitrogen content from 3 to 8 weight percent.

14. A light-sensitive mixture according to claim 13, wherein said esterified reaction product has a diazo nitrogen content from 4.5 to 7.5 weight percent.

15. A light-sensitive mixture according to claim 1, comprising from about 5 to about 50 weight percent, relative to the non-volatile constituents, naphthoquinonediazidesulfonic acid ester.

16. A light-sensitive mixture according to claim 16, comprising from about 10 to about 30 weight percent, relative to the non-volatile constituents, naphthoquinonediazidesulfonic acid ester.

17. A light-sensitive mixture according to claim 1, wherein said binder is a phenolic resin.

18. A light-sensitive mixture according to claim 18, wherein said binder is a light-stable, film-dorming phenolic resin having an average molecular weight from about 300 to about 5000.

19. A light-sensitive mixture according to claim 19, wherein said phenolic resin in selected from the group consisting of phenol-formaldehyde novolac resins, cresol-formaldehyde novolac resins and phenol-modified xylenol-formaldehyde novolac resins.

20. A light-sensitive mixture according to claim 1, wherein said binder comprises from about 50 to about 90 weight percent of said mixture.

21. A light-sensitive mixture according to claim 20, wherein said binder comprises from about 65 to about 85 weight percent of said mixture.

* * * * *

UNITED STATES PATENT AND TRADEMARK OFFICE
CERTIFICATE OF CORRECTION

PATENT NO. : 4,424,270
DATED      : January 3, 1984
INVENTOR(S): Fritz ERDMANN and Ulrich SIMON It is certified that error appears in the above-identified patent and that said Letters Patent is hereby corrected as shown below:

IN THE CLAIMS:

Column 12, Claim 16, line 1, kindly delete "16" and insert instead -- 15 --.

Column 12, Claim 18, line 1, kindly delete "18" and insert instead -- 17 --.

Column 12, Claim 19, line 1, kindly delete "19" and insert instead -- 18 --.

Column 12, Claim 19, line 2, kindly delete "in" and insert instead -- is --.

Signed and Sealed this

Seventeenth Day of July 1984

[SEAL]

Attest:

*Attesting Officer*

GERALD J. MOSSINGHOFF
*Commissioner of Patents and Trademarks*